United States Patent [19]
Zrilic

[11] Patent Number: 5,349,353
[45] Date of Patent: Sep. 20, 1994

[54] METHOD AND APPARATUS FOR MIXED ANALOG AND DIGITAL PROCESSING OF DELTA MODULATED PULSE STREAMS INCLUDING DIGITAL-TO-ANALOG CONVERSION OF A DIGITAL INPUT SIGNAL

[76] Inventor: Djuro G. Zrilic, 1108 Columbia St., Las Vegas, N. Mex. 87701

[21] Appl. No.: 997,498

[22] Filed: Dec. 28, 1992

[51] Int. Cl.⁵ .............................................. H03M 1/66
[52] U.S. Cl. .................................... 341/144; 341/143
[58] Field of Search ............... 341/143, 144, 145, 156; 375/27, 28, 34

[56] References Cited

PUBLICATIONS

Freedman and Zrilic, "Nonlinear Arithmetic Operations on the Delta Sigma Pulse Stream," *Signal Processing* 21, (1990) pp. 25–35.

Kouvaras, "Operations on delta–modulated signals and their application in the realization of digital filters," *Radio and Elec. Engr.*, vol. 28, No. 9, pp. 431–438, Sep. 1978.

Davis, et al., "Merging Data Converters and DSPs for Mixed–Signal Processors," *IEEE Micro*, Oct. 1990, pp. 17–27.

Maloberti, "Non Conventional Signal Processing by the Use of Sigma Delta Technique; A Tutorial Introduction," *IEEE*, 1992, pp. 2645–2648.

Qiuting, "Monolithic CMOS Compandors Based On$\Sigma$-$\Delta$ Oversampling," *IEEE, 1992, pp. 2649–2652*.

Takasuka et al., "A Sigma–Delta Based Square–Law Compandor," *IEEE 1990 Custom Integrated Circuits Conference*, 1990, pp. 12.7.1 et seq.

Hauser et al., "MOS ADC–Filter Combination That Does Not Require Precision Analog Components," *ISSCC Dig. Tech. Pap.*, Feb. 1985, pp. 80–81.

Inose et al., "A Unity Bit Coding–Method by Negative Feedback," *Proc. IEEE*, Nov. 1963 vol. 51, pp. 1524–2535.

Weir, "Sigma–delta conversion," *Electronics World-+Wireless World*, Dec. 1989, pp. 1196–1199.

Ritoniemi, et al., "Fully Differential CMOS Sigma-Delta Modulator for High Performance Analog-To-Digital Conversion with 5v Operating Voltage," *IEEE Proc. ISCAS'88*, Jun. 1988, pp. 2321–2326.

*Primary Examiner*—Brian K. Young
*Attorney, Agent, or Firm*—Richard A. Bachand (List continued on next page.)

[57] ABSTRACT

A digital processing circuit and method includes a signal modulator connected to modulate a delta-modulated first input signal with a digital second input signal to produce a delta modulated output pulse stream. The digital output can be directly used for many purposes, or the digital output can be demodulated to produce an analog output signal using a low pass filter. Also, if desired, the delta modulated pulse first pulse stream can be generated from an analog signal input through use of a sigma-delta modulator. The signal modulator includes a plurality of switches, each operated by a respective bit of the digital second input signal to switch between the delta modulated first input signal and a known pulse sequence, such as an idle sequence, for delivery to a switch output. A plurality of adder circuits are connected in series to add the successive outputs of the plurality of switches to the delta modulated pulse first input signal to produce the delta modulated output pulse stream. Each of the adder circuits comprises a full binary adder and a D-type flip-flop, the full binary adder having two binary signal inputs and a carry input, and having a sum output and a carry output, the sum output being connected to the carry input through the D-type flip-flop. The known pulse sequence, such as the idle sequence is connected to the input of the first adder circuit. The circuit can be used for many purposes, for example, to provide a multiplying digital-to-analog signal converter, a precision attenuator, or the like, without a requirement for precision components, circuit matching or other special analog signal matching techniques.

36 Claims, 5 Drawing Sheets

OTHER PUBLICATIONS

Yukawa, "Constraints Analysis for Oversampling A-to-D Converter Structures on VLSI Implementation," *IEEE Proc. ISCAS'87,* May 1987, pp. 467–472.

Hurst et al., "Delta–Sigma A/Ds With Reduced Sensitivity to OP AMP Noise and Gain," *IEEE Proc. ISCAS'89,* May 1989, pp, 254–257.

Hauser, "Technology Scaling and Performance Limitations in Delta–Sigma Analog–Digital Converters," *IEEE Proc. ISCAS'90,* May 1990, pp. 356–359.

Hauser, et al., "Circuit and Technology Considerations for MOS Delta-Sigma A/D Converters," *IEEE Proc. ISCAS'86,* pp. 1310–1315.

Ferguson, Jr., et al., "One Bit Higher Order Sigma–Delta A/D Converters," *IEEE Proc. ISCAS'90,* May 1990, pp. 890–893.

Chao, et al., "A Higher Order Topology for Interpolative Modulators for Over-Sampling A/D converters," *IEEE Trans Cir. and Sys,* vol. CAS-37, May 1990, pp. 309–318.

Candy, "A Use of Double Integration in Sigma Delta Modulation," *IEEE Trans. Commun.,* vol. COM-33, May 1985, pp. 247–258.

Bishop, et al., "Table–Based Simulation of Delta–Sigma Modulators," *IEEE Trans. Circuits and Sys.,* vol. CAS-37, May 1990, pp. 447–451.

Agrawal, et al., "Design Methodology for $\Sigma\Delta M$," *IEEE Trans. Commun.,* vol. COM-31, May 1983, pp. 360–370.

Ritoniemi, et al., "Design of Stable High Order 1–Bit Sigma–Delta Modulators," *IEEE Proc. ISCAS'90,* May 1990, pp. 3267–3270.

Candy, "The Structure of Quantization Noise from Sigma–Delta Modulation," *IEEE Trans. Commun.,* vol. COM-29, Sep. 1981, pp. 1316–1323.

Candy, "Oversampling Methods for A/D and D/A Conversion," pp. 1–25, 1992.

Steele, *Delta Modulation Systems,* Pentech Press, London, 1975, pp. 1–34.

METHOD AND APPARATUS FOR MIXED ANALOG AND DIGITAL PROCESSING OF DELTA MODULATED PULSE STREAMS INCLUDING DIGITAL-TO-ANALOG CONVERSION OF A DIGITAL INPUT SIGNAL

BACKGROUND OF THE INVENTION

1. Field of the Invention This invention relates to improvements in signal processing methods and circuits, and in one aspect to methods and circuits for mixed analog and digital processing of one or more delta modulated pulse streams; and still more particularly to improvements in digital-to-analog converters, and, more particularly, to improvements of digital-to-analog converters that can be easily integrated into integrated circuits or the like with reduced power consumption and circuit area requirements; and also to improvements in digital attenuators, and, more particularly, to attenuators that can be realized without precision resistors, precision parts, or complex characteristic matching among stages.

2. Technical Background

Processing circuits and techniques employing delta- and sigma-delta-modulated signals is receiving increasing interest in many applications. To date, however, ordinarily processing techniques normally are not performed purely on a digital level, but if properly performed, many circuits that heretofore required precision parts or critical circuit trimming or adjustment can be realized using purely digital processing techniques employing delta- and sigma-delta-modulation signals.

For example, the need for faster digital to analog converters (DACs) is much greater today than in the past. Today, a wide range of applications exist for DACs, in such diverse areas as instrumentation, CAD systems, image processing, direct digital waveform synthesis, and so on. However, in fast digital manipulation systems, the DAC is the bottleneck in the link to the analog world.

The usual deciding factors in choosing a DAC are its resolution and speed. In general, the faster the DAC, the higher the resolution that can be attained. Consequently, most of today's digital to analog converters include additional digital support functions. However, the performance of an analog signal can be degraded by such additional digital circuitry, and in mixed digital-analog systems there are inevitable compromises.

Conventional digital to analog conversion usually involves analog voltages division (by two) and summation. For this process, well matched passive components, such as linear nickel-chrome resistors, or double polysilicon capacitors, are generally used. The processing costs for such linear nickel-chrome resistors, double polysilicon capacitors are relatively high.

A commonly used digital-to-analog circuit 10 of the prior art is the voltage summing, or R-2R ladder network, as shown in FIG. 1. The ladder network includes a number of resistors 11-16 of value R. The junctions between the respective resistors 11-16 are connected by resistors 18-25, of value 2R, to respective switches 30-36. The digital signal to be converted is connected to the switches 30-36 to actuate them to one or the other switch pole, depending upon the state of the bit associated with each of the switches 30-36.

If, for example, the least significant bit that actuates switch 30 is a logical "1", the switch 30 is connected to the left node that is, in turn, connected to $E_{ref}$. On the other hand, if the logic state of the least significant bit controlling switch 30 is a logic "0", the switch 30 is operated to connect to the right node that is, in turn, connected to ground, or other reference potential. The operation of the remaining switches 31-36 is similar, each corresponding to the bits of the digital input signal. As is well known, the analog output seen at the output terminal $E_o$ is the sum of the voltages produced through the action of the particular "1's" of switches 30-36 that are connected to $E_{ref}$, in accordance with the voltage divider ratio represented by the resistances connected thereby.

Similarly, attenuator circuits can be fabricated in a manner similar to digital-to-analog converter circuits. However attenuator circuits typically used today require precision in their construction; for example, in the provision of special precision matched resistors, component trimming, stage matching, and the like.

What is needed is a circuit and method that can employ fast digital processing techniques to accomplish digital-to-analog signal conversion, signal attenuation, and similar functions, that does not require such precision parts and construction, but which will, nevertheless provide adequate performance at reasonable cost.

In the realization of the digital processing circuits of the invention described below, a delta adder circuit is employed. One known delta adder circuit 40 (herein denoted ΔA) that can be used is shown in FIG. 2, and is constructed in accordance with known techniques, as explained, for example, by N. Kouvaras, "Operations on delta-modulated signals and their applications in the realization of digital filters," *The Radio and Electronics Engineer*, vol. 48, No. 9, September, 1978, pp. 431-438, incorporated herein by reference.

The delta adder 40 includes a conventional binary full-adder 41 with the SUM and CARRY outputs interchanged, and a conventional D-type flip flop 42 connected to the CARRY input. Thus, digital input signals $X_n$ and $Y_n$ are applied to the "a" and "b" input terminals. The CARRY output, $C_n$, forms the sum "S" output and the SUM output, $S_n$, forms the carry "C" output, the connections, as mentioned, being the reverse of the normal operation of the binary adder.

The output on the SUM, "S", output of the binary adder 41 is connected to the D input of a D-type flip-flop 42, the output of which is connected to the CARRY, "c", input of the binary adder 41. Therefore, the operation of the delta adder circuit 40 of FIG. 2 is to add the digital input signals $X_n$ and $Y_n$ applied to the "a" and "b" input terminals. Assuming $\{X_n\}$ and $\{Y_n\}$ to be binary sigma-delta sequences, then the output sequences $\{S_n\}$ and $\{C_n\}$ are also binary sigma-delta sequences. An equivalent circuit of the Delta adder of FIG. 2 is shown in FIG. 3.

SUMMARY OF THE INVENTION

In light of the above, it is, therefore, an object of the invention to provide an improved mixed analog and digital processing circuit and method.

It is another object of the invention to provide an improved circuit and method of the type described that is versatile, useable in many varied applications.

It is another object of the invention to provide an improved digital-to-analog converter.

It is another object of the invention to provide a digital-to-analog converter of the type described that is of fast speed with higher resolution than that of previous digital-to-analog converters.

It is another object of the invention to provide an improved digital-to-analog converter of the type described that can be relatively inexpensively realized.

It is another object of the invention to provide an improved digital-to-analog converter of the type described that can be easily integrated into integrated circuits without a requirement for bulky or large components.

It is yet another object of the invention to provide an improved digital-to-analog converter of the type described that can be formed in an integrated circuit with minimum power requirements and minimum area needed for circuit fabrication.

It is another object of the invention to provide an improved attenuator circuit.

It is another object of the invention to provide an attenuator circuit of the type described that is of fast speed with high resolution.

It is another object of the invention to provide an improved attenuator circuit of the type described that can be relatively inexpensively realized.

It is another object of the invention to provide an improved attenuator circuit of the type described that can be easily integrated into integrated circuits without a requirement for bulky or large components, without precision resistors and without a requirement for component matching among stages.

It is yet another object of the invention to provide an improved digital-to-analog converter of the type described that can be formed in an integrated circuit with minimum power requirements and minimum area needed for circuit fabrication.

It is still another object of the invention to provide an improved circuit for digitally multiplying a plurality of digital signals of same or different width, without requiring intermediate analog conversion.

It is still another object of the invention to provide an improved circuit for digitally multiplying digital signals of the type described that has reduced quantization noise from equivalent analog circuits.

These and other objects, features and advantages of the invention will be apparent to those skilled in the art from the following detailed description of the invention, when read in conjunction with the accompanying drawings and appended claims.

Thus, in accordance with a broad aspect of the inventions, a digital processing circuit is presented that includes a first node for receiving a delta modulated pulse first input signal and a second node for receiving a digital second input signal. A signal modulator is connected to receive the first and second input signals and for modulating the first input signal with the second input signal to produce a delta modulated output pulse stream. The digital output can be directly used for many purposes, or the digital output can be demodulated to produce an analog output signal, such as through a low pass filter. Also, if desired, the delta modulated pulse first pulse stream can be generated from an analog signal input through use of a sigma-delta modulator.

The signal modulator for modulating the delta modulated pulse first input signal with the digital second input signal includes a plurality of switches, each operated by a respective bit of the digital second input signal to switch between the delta modulated first input signal and a known pulse sequence, such as an idle sequence, for delivery to a switch output. A plurality of adder circuits are connected in series to add the successive outputs of the plurality of switches to the delta modulated pulse first input signal to produce the delta modulated output pulse stream. Each of the adder circuits comprises a full binary adder and a D-type flip-flop, the full binary adder having two binary signal inputs and a carry input, and having a sum output and a carry output, the sum output being connected to the carry input through the D-type flip-flop. The known pulse sequence, such as the idle sequence is connected to the input of the first adder circuit.

The circuit can be used for many purposes, for example, to provide a multiplying digital-to-analog signal converter, a precision attenuator, or the like, without a requirement for precision components, circuit matching or other special analog signal matching techniques.

In accordance with another broad aspect of the invention, a method is providing for digitally multiplying an input signal by a digital signal to produce a multiplied output signal. The method includes providing the input signal in a binary delta modulated signal form, and, depending upon the state of each successive of the digital signal, selectively adding the binary delta modulated signal to a weighted, cumulating sum, beginning with an idle sequence to produce a binary delta modulated signal output. If desired the binary delta modulated signal output can be demodulated to provide an analog output signal, and the step of providing the input signal in a binary delta modulated signal form can comprise sigma-delta-modulating an analog input signal.

In accordance with still another broad aspect of the invention, a multiple stage digital processing circuit is presented. The multiple stage circuit includes a first node for receiving a delta modulated pulse first input signal, a second node for receiving a digital second input signal, and a third node for receiving a digital third input signal. A first signal modulator is connected to receive the first and second input signals and for modulating the first input signal with the second input signal to produce an intermediate delta modulated output pulse stream. A second signal modulator is then connected to receive the intermediate delta modulated output pulse stream and third input signals and for modulating the intermediate signal with the third input signal to produce an output delta modulated output pulse stream. The second and third signals are digital signals that can be of the same or different widths.

BRIEF DESCRIPTION OF THE DRAWINGS

The invention is illustrated in the accompanying drawing in which.

DETAILED DESCRIPTION OF THE PREFERRED EMBODIMENTS

Figure 4:
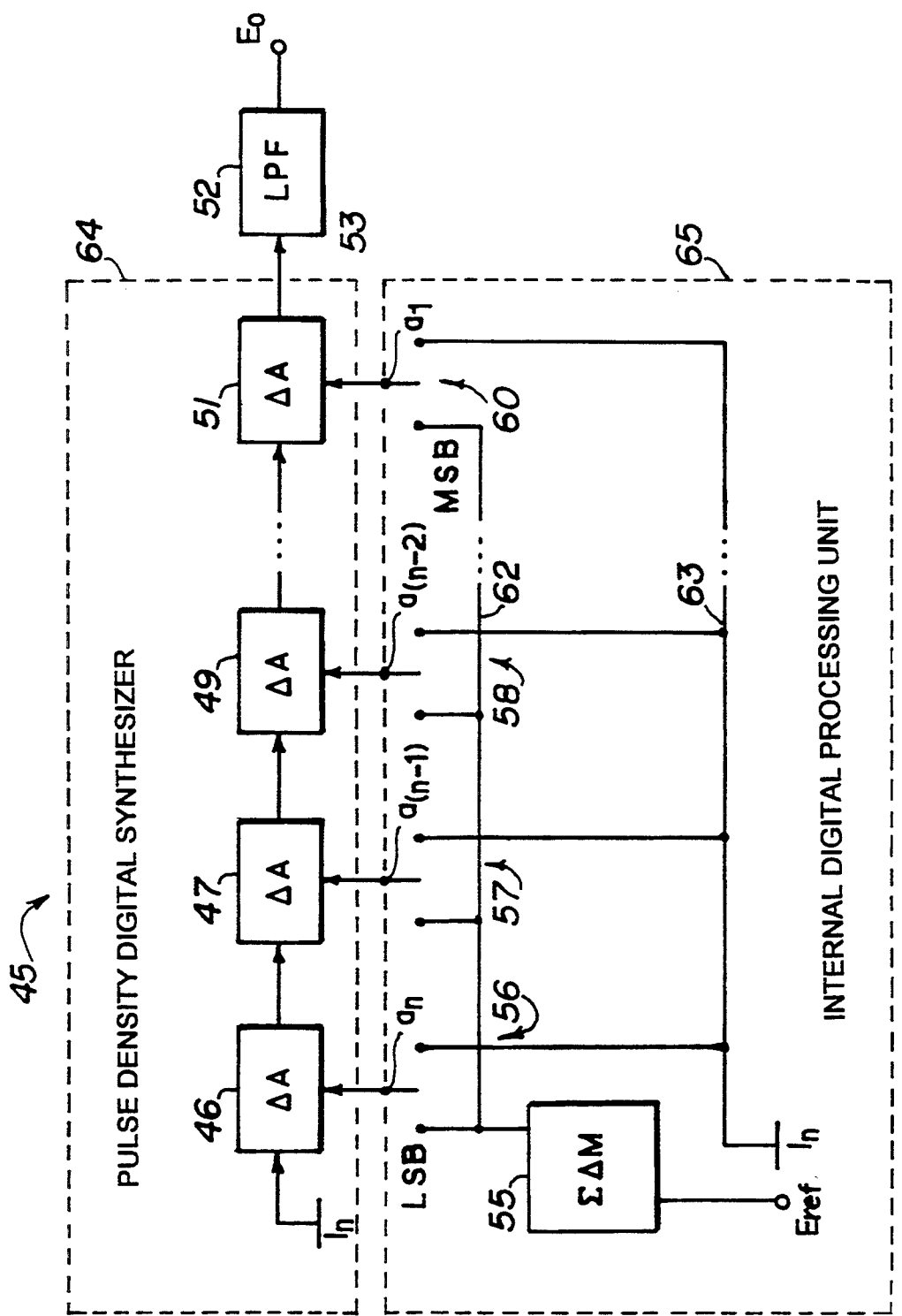
FIG. 4 is an electrical schematic diagram of a signal processing circuit, in accordance with a preferred embodiment of the present invention.

A circuit 45 for processing mixed analog and digital signals, in accordance with the invention, is shown in FIG. 4. The circuit 45, as will become apparent, can be used for multiplying first and second signals, one of which can be a digital signal and the other an analog signal, and, by appropriate choice of the digital signal, a multiplying digital-to-analog converter can be realized. The mixed analog and digital processing circuit 45 includes two sections, a pulse density digital synthesizer section 64 and an internal digital processing unit 65. It will be appreciated that the circuit 45 can be realized in virtually any technology, for example, TTL, CMOS, and so forth.

Figure 2:
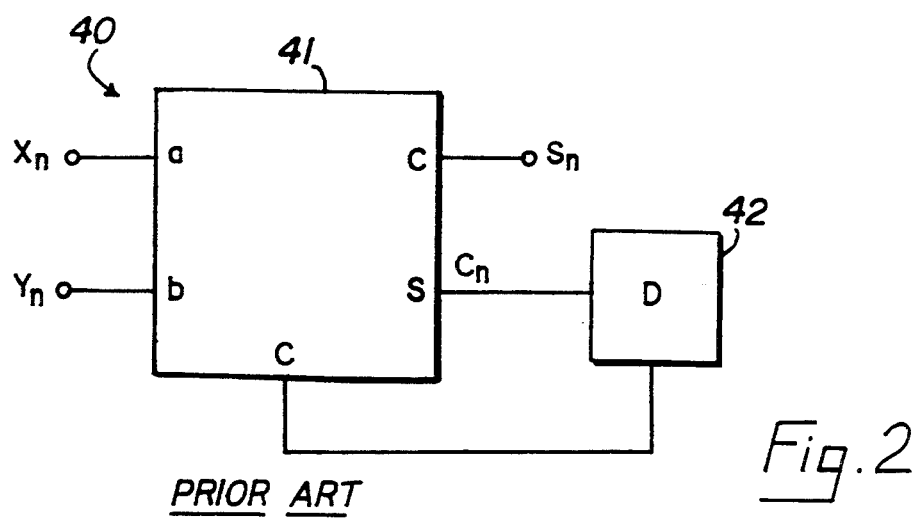
FIG. 2 is an electrical schematic diagram of a Delta adder circuit, in accordance with the prior art, for adding to digital input signals.
Figure 3:
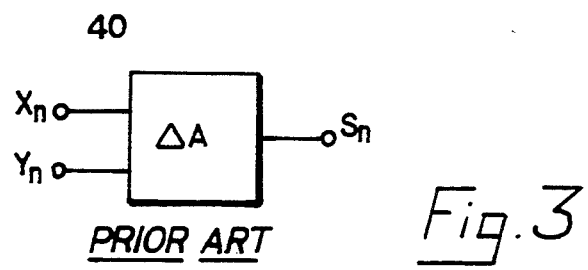
FIG. 3 is an electrical schematic diagram of an equivalent circuit of the Delta adder of FIG. 2, in accordance with the prior art.

To ensure high speed operation, fast voltage adders are required. The gain of the voltage adder is the dominant parameter that effects the differential and integral linearity of the DAC. Modest accuracy requires the use of a voltage adder with reasonably well-controlled gain. Instead of dealing operational amplifiers and a number of well-matched resistors, a more promising approach is to use the binary delta-adder, as described above with reference to FIGS. 2 and 3. Thus, the pulse density digital synthesizer section 64 includes a number of delta adders 46–51. Each of the delta adders is constructed in the manner described above with reference to FIGS. 2 and 3, with the two inputs representing inputs $X_n$ and $Y_n$ as described above. Each of the delta adders 46–51 can be of similar construction. It will be appreciated, furthermore, that although only four stages are shown, a number of stages can be employed depending upon the number of bits comprising the digital signal to be applied.

In the embodiment shown, a plurality of switches 56–60 operated in response to the logic states of the respective bits $a_{(n-1)}$. . . $a_1$ of the digital signal applied thereto each have outputs connected to a respective input of one of the delta adders 46–51. The switches can be, for example, well known transistor switches, or other switching means operated by the state of a digital signal applied to an input thereof. The output of each of the delta adders 46–51 is connected to an input of the next following stage, except the final stage 51 which provides a pulse density modulated output on line 53. The pulse density modulated output on line 53 is connected to an input of a low pass filter 52 from which the analog output voltage, $E_o$, is generated. The low pass filter 52 serves as a delta demodulation circuit for the pulse density modulated output signal appearing on line 53 at the output of the delta adder 51. It will be appreciated, however, that other delta demodulation techniques can be equally advantageously employed in place of the low pass filter 52. Also, it will be appreciated that since the sigma-delta-modulator 55 (described below) highly over samples the analog input signal $E_{ref}$, the design of the low pass filter 52 can be relatively relaxed, further enabling low cost technologies and design techniques to be employed.

The input to the first delta adder 46 is connected to receive a known pulse sequence, such as an "idle sequence". An "idle sequence" is a sequence, such as . . . +1, −1, +1, . . . , or . . . 0,1,0,1, . . . , or the like, depending upon the logic convention used, that changes states at a fundamental lowest frequency of one-half the frequency of the sampling rate of the sigma-delta-modulator 55, below described, to produce a symmetrical pattern, over the time period of interest to represent a zero or reference value about which the signal varies.

Thus, in operation, each of the delta adder stages 46–51 serves to add the output of the preceding stage with the output from the respective digital switches 56–60, with the exception of the first stage 46, which adds the idle sequence to the output from the first switch 56.

The internal digital processing unit 65 includes the switches 56–60 mentioned above, the switches 56–60 each being connected to be operated by the logic state of the respective bits, $a_n$–$a_1$, of the digital signal respectively applied thereto. Thus, for example, in a logic signal having "n" bits, $a_n a_n$, the least significant bit (LSB), is connected to operate the logic switch 56 and $a_1$, the most significant bit (MSB), is connected to operate the logic switch 60. Depending upon the state of the bits of the digital signal, the logic switch with which the particular bit is associated is operated to selectively apply the output either from a sigma-delta-modulator 55 or a known signal on line 63 to the input of the respective delta adder with which the switch is associated. The known signal on line 63 can be, for example, the same idle sequence that is applied to the input of the first delta adder 46.

The sigma-delta-modulator 55 can be of standard construction, such as that described by Freedman and Zrilic, in "Nonlinear Arithmetic Operations on the Delta Sigma Pulse Stream," *Signal Processing*, Vol. 21, No. 1, pp. 25–25, September 1990, at p. 27, said article being incorporated herein by reference in its entirety. The reference signal, $E_{ref}$ is applied to the input of the sigma delta modulator 55, and the output is developed on line 62 applied to one side of the digital switches 56–60. The sampling frequency of the sigma delta modulator 55 can be selected such that the sampling rate of the input signal is significantly higher than the highest frequency to be processed. For example, a sampling rate of 100 times, or other significant over sampling rate, can be employed. As mentioned, the idle sequence applied to the other side of the switches 56–60 on line 63 as well as to the input of the delta adder 46 can be selected to be one-half of the sampling frequency of the sigma delta modulator 55.

It will be appreciated that although a sigma-delta-modulator 55 is preferred in the construction and operation of the circuit, ordinary delta modulators, or linear delta modulators, can be also used. When ordinary, or linear, delta modulators are used, the demodulator output that is provided by the low pass filter alone in the case when a sigma-delta-modulator is used, as illustrated, is more complicated, requiring the use of an integrator, or other appropriate circuitry (not shown).

The operation of the circuit 45 is to combine the analog input signal $E_{ref}$ applied to the sigma delta modulator 55 with the digital signal applied via the switches 56–60. This combination can be considered the modulation or impression of one digital signal upon the other. The signals are then weighted and combined through the successive serial operations of the delta adders 46–51. It will be appreciated that the output from the last delta adder 51 is a digital signal appearing on line 53. The nature of the signal on line 53 is a digital signal having a pulse density that is directly related to the combination of the input analog signal $E_{ref}$ and the digital signal $a_1 \ldots a_n$. The pulse density signal on line 53 is filtered by a low pass filter 52 to produce an analog output signal $E_o$.

It will also be appreciated that the analog and digital signals are effectively multiplied so that, for example, a first signal applied to the analog input to the sigma delta modulator 55 is multiplied times the digital signal applied to the switches 56–60. This characteristic is extremely useful in many operations in which such signal multiplication is required. It will be appreciated that the entire circuit 45 can be realized with relatively modest electrical components, and, since all of the operations signal a combination operations are digital, no high precision resistors or processing techniques to form analog components is required.

Figure 1:
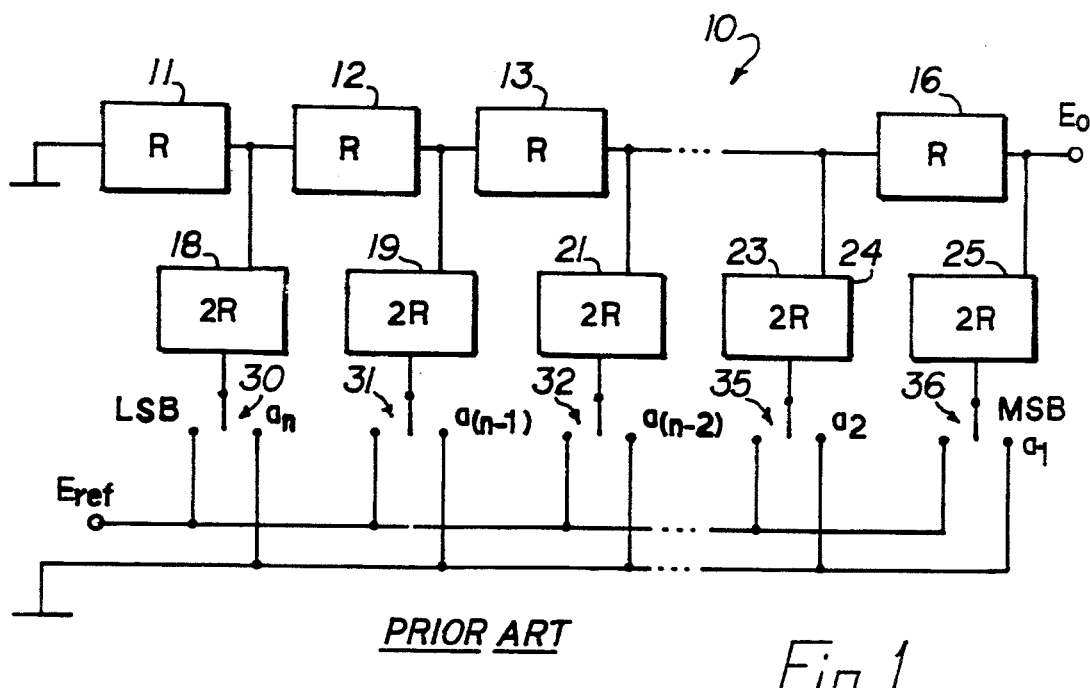
FIG. 1 is an electrical schematic diagram of a typical ladder network digital-to-analog converter, in accordance with the prior art.

Still more specifically, a multiplying digital to analog converter can be realized, requiring only appropriate selection of in the analog and digital input signals. Thus, the circuit of FIG. 1 can be used directly as a voltage mode digital to analog converter circuit that eliminates the need for passive components in performing voltage scaling uses low cost, first order, linear delta-modulator (LΔAM) encoders in signal processing applications. The circuit uses a low cost digital network for direct arithmetic operations on a (LΔAM) pulse stream. The circuit may have two optional outputs, one digital and the other analog.

Figure 5:
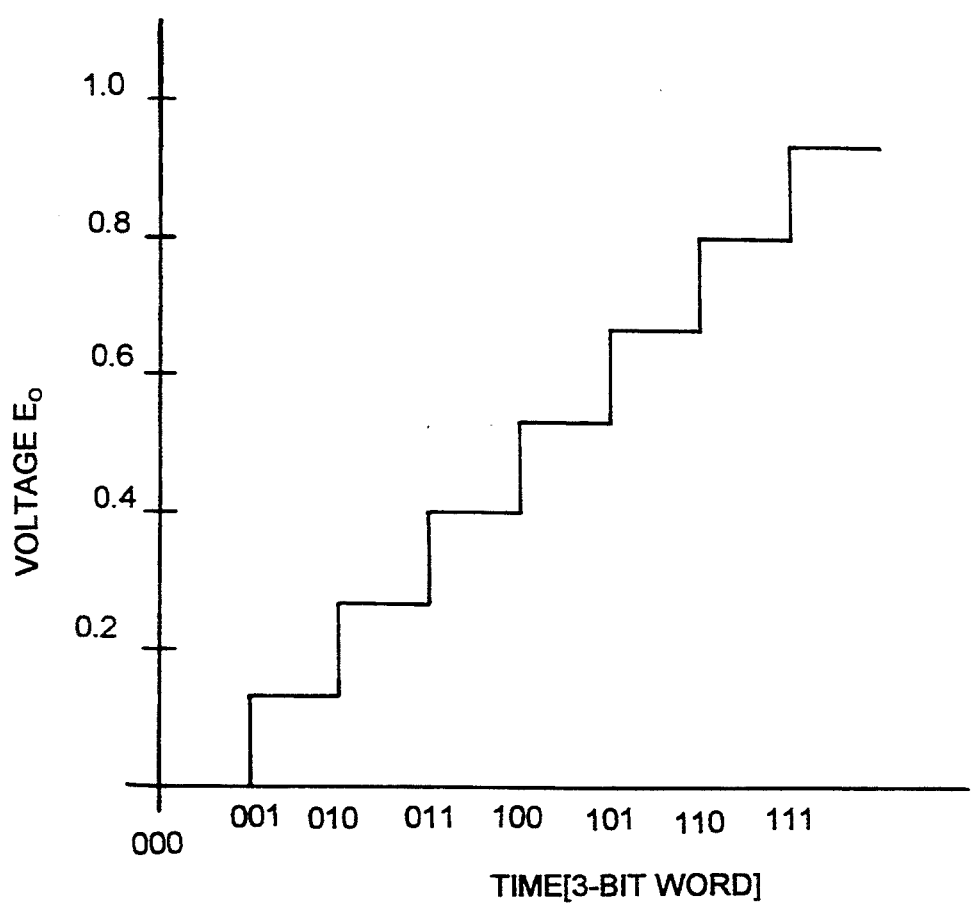
FIG. 5 is a graph of the transfer function of the circuit of FIG. 4, for a 3-bit digital input signal and dc input reference voltage.

The transfer function of the circuit 45 for a steady state analog input voltage is shown in FIG. 5, the transfer function FIG. 5 being essentially the same as that realized by an ideal digital-to-analog circuit of the prior art, such as that described above with reference to FIG. 1. Moreover, assuming that the analog input signal to the sigma delta modulator 55 is of time varying form, such as a sign wave, or the like, the output from the low pass filter 52 represents the multiplication of the time varying analog input signal with the digital signal applied to the switches 56–60.

Figure 6:
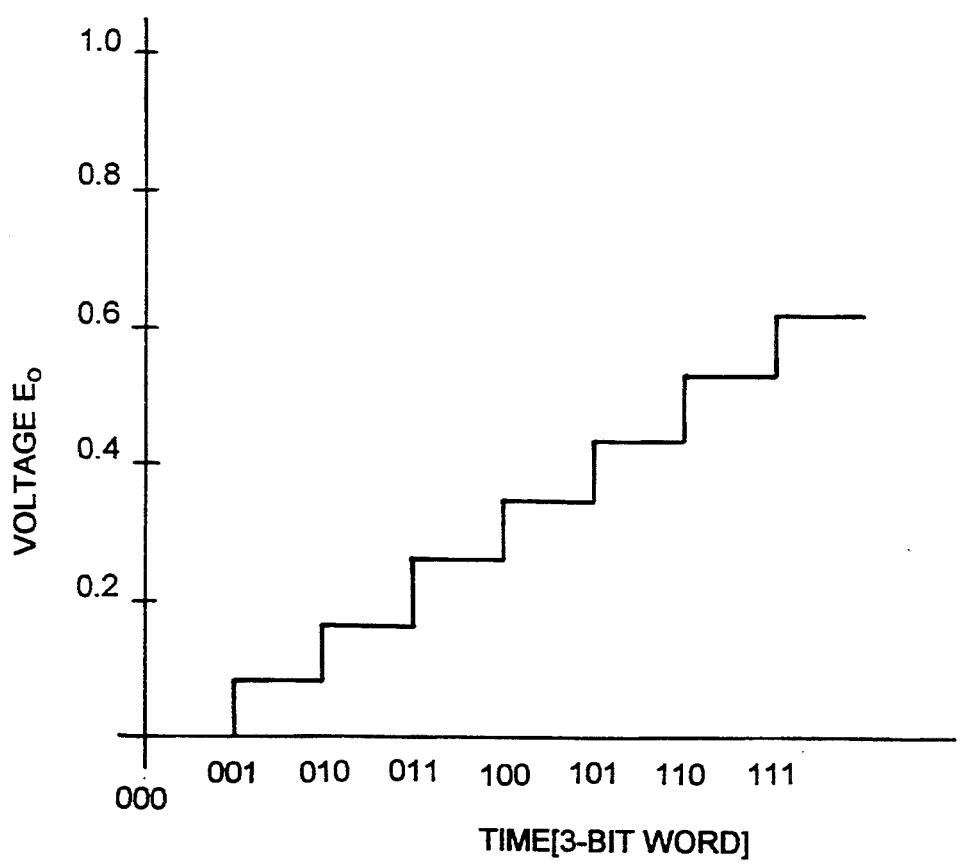
FIG. 6 is a graph of the transfer function of the circuit of FIG. 4, when used as a switch-mode DAC, without requiring the sigma-delta-modulation of the input signal.

Moreover, in applications where it is desired to provide $E_{REF}$ as a DC, or steady state, signal, a fast switch (not shown) can be used in place of the sigma-delta-modulator. The transfer characteristic of a switch-mode DAC is shown in FIG. 6.

Figures 7, 8:
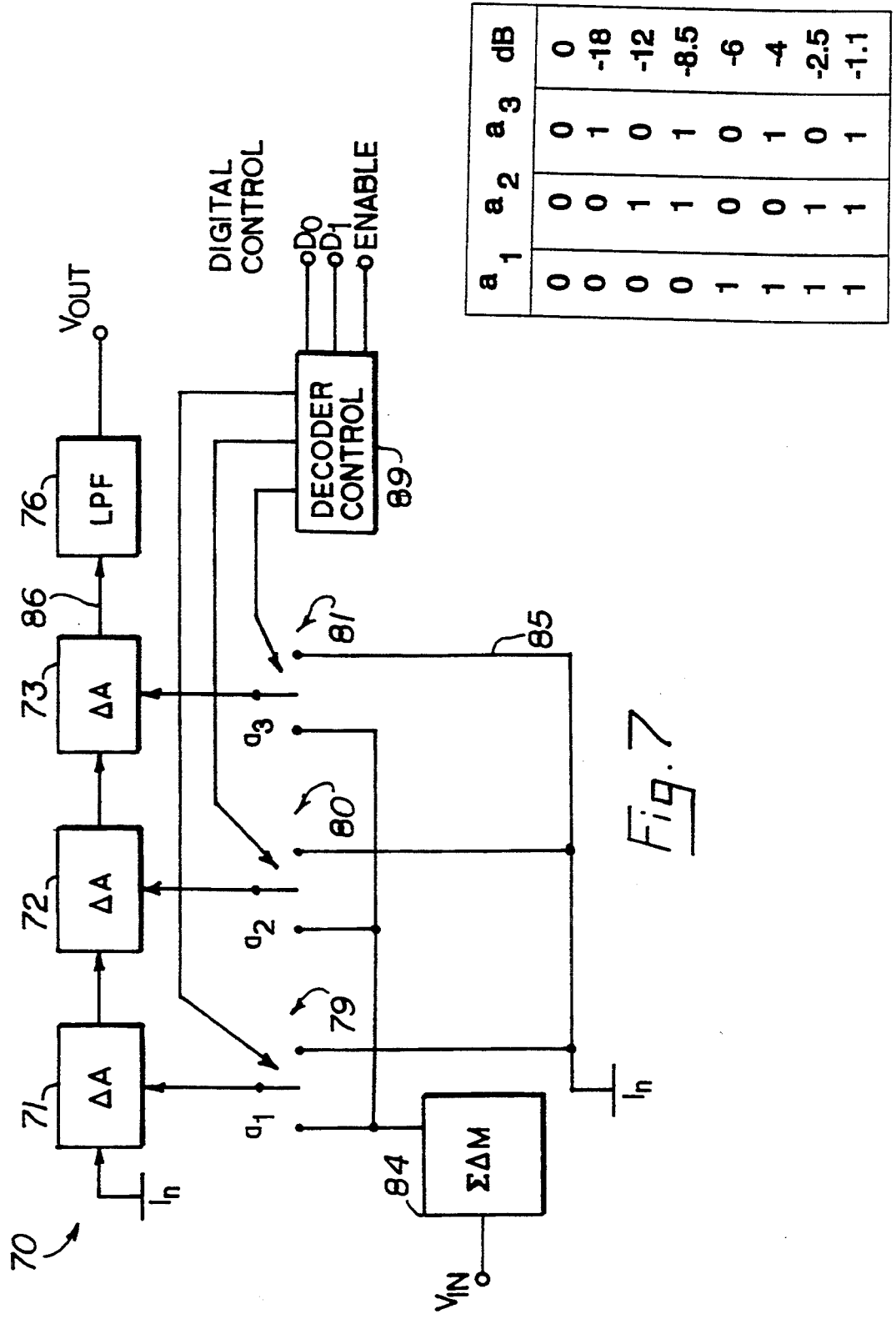
FIG. 7 is an electrical schematic diagram showing a three stage attenuator circuit, in accordance with the present invention for attenuating an analog input signal selectively in accordance with a three bit digital control signal.
FIG. 8 is a table showing the attenuation realized in the three stage circuit of FIG. 6 for various values of an digital input control signal.

It will be additionally realized that since the delta adders 46–51 represent sequential levels or ratios of signal bits applied to their respective inputs, the circuit 45 can be employed as an attenuation circuit, to controllably attenuate an analog signal applied to the input of the sigma delta modulator 55, by the appropriate selection of the respective bits of the digital word applied to the switches 56–60. One embodiment of an attenuation circuit 70 in accordance with the invention is shown in FIG. 7.

The attenuation circuit 70 includes three delta adders 71–73, which may be constructed in a manner similar to the delta adder circuit described above with reference to FIGS. 2 and 3. Each of the delta adders 71–73 has a first input connected to receive the output from the preceding stage, except the first delta adder 71, which is connected to receive a known signal, such as an idle sequence. The output on line 86 from the last delta adder 76 may be connected to a delta modulation demodulator circuit, such as a low pass filter 76 illustrated, or, if desired, the digital signal appearing on line 86 can be used directly in a desired digital application. The output from the low pass filter 76 is an analog voltage out, $V_{OUT}$.

The second input to each of the delta adders 71–76 is the output of respective switches 79–81. The switches 79–81, which can be, for example, CMOS (TTL) switches, or other suitable devices, are controlled by the output of a decoder control circuit 89 which in the case illustrated, provides a three bit signal, $a_1$–$a_3$. The switches 79–81 serve to connect either the delta sigma pulse stream from the output of the sigma-delta modulator 84 or the idle sequence on line 85 to the respective second inputs of the delta adders 71–73. As before, the input to the sigma-delta modulator 84 is an analog voltage input signal, $V_{IN}$.

It will be appreciated that the attenuator circuit 70 requires no precision resistors, and easily integrated into an integrated circuit, if desired. Furthermore, no divider matching is required, because only logic levels exist between each of the delta adders 71–73. Providing that the switch for each stage is closed, the input signal, $V_{IN}$, will be attenuated according to the basic voltage divider relationship at each stage. The attenuation in dB of the attenuator circuit 70 is shown in FIG. 8, for each bit value of a three bit digital control signal. Thus, since each delta adder attenuates by 0.5, if all of the switches 79–81 are open, the idle sequence, $I_n$ is filtered, and $V_{OUT}$ is 0. On the other hand, if all of the switches are closed, nearly all the signal strength will be passed to the next stage through the delta adders.

Figure 9:
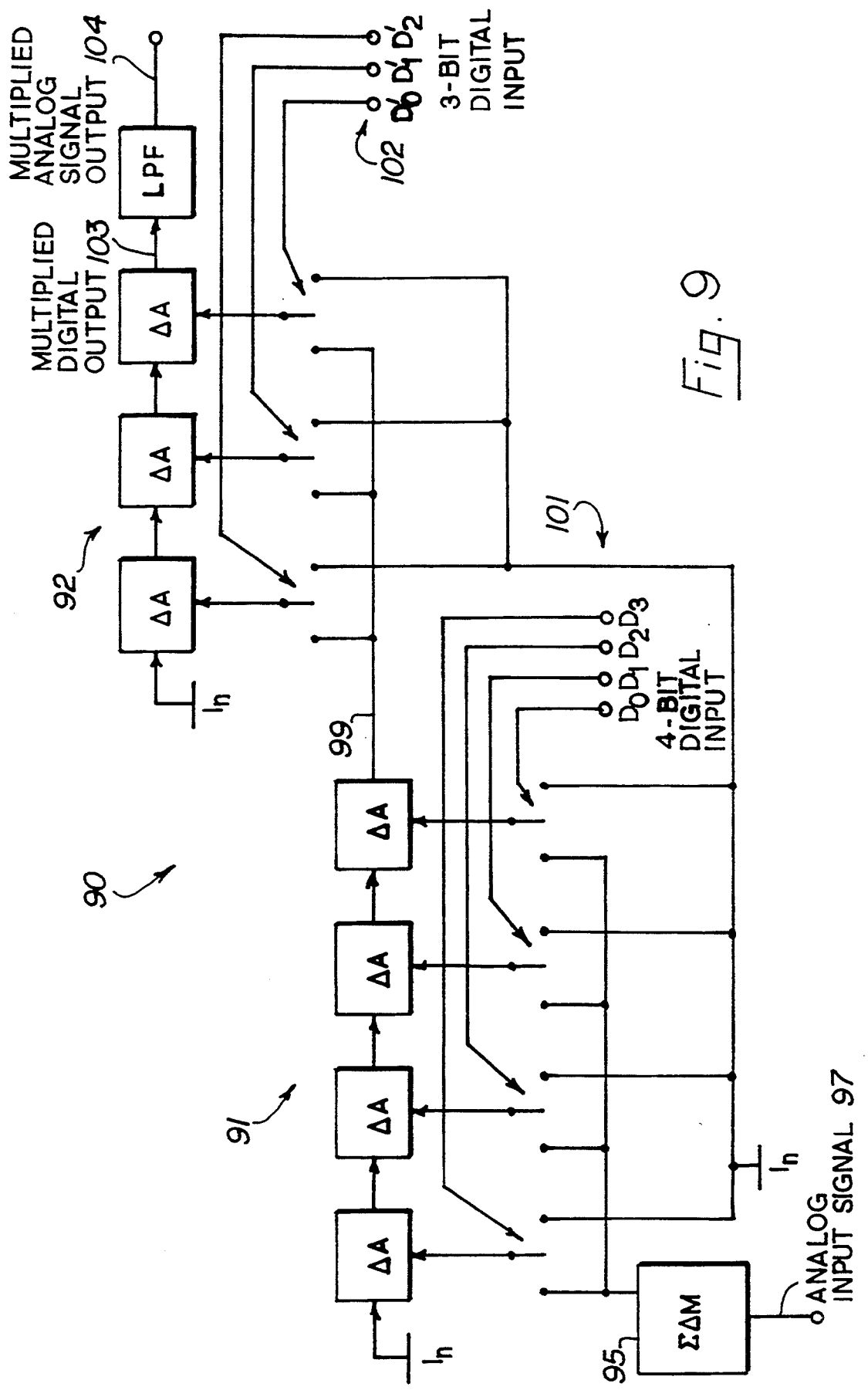
FIG. 9 is an electrical schematic diagram of a signal processing circuit, in accordance with an alternative embodiment of the invention, in which two signal processing circuits are cascaded to digitally multiply two digital signals.

It will be appreciated that multiple circuits as described with reference to FIG. 4 can be connected in cascade manner, a two stage circuit 90 being shown in FIG. 9, enabling the digital multiplication of two, or more, with additional cascade circuits, digital signals. Thus, as shown, a circuit 90 includes a first stage 91 that receives a digital output signal from a sigma-delta modulator 95, derived from an analog signal input 97. The first stage circuit 91, in the embodiment illustrated, receives a 4-bit digital input signal, $D_o$–$D_3$, that is combined with the output signal from the sigma-delta-modulator 95. The output appears as a digital pulse stream on line 99, as is provided as the input to the second stage 92. It is noted that the input signal on line 99 to the second stage 92 is already in the correct form, i.e., a delta modulated signal; consequently, no modulation or other processing is necessary to condition the signal.

The signal on the input line 99 is multiplied with, for example, a 3-bit wide digital signal, $D_o'$–$D_2'$, 102. The multiplied signal is produced as an output in digital form on output line 103, or demodulated by a low pass filter 105 for output in analog form on line 104.

The uses for the circuit 90 are manifold; for example, the circuit can be used to scale the signal from the first stage with a digital signal of the same or different width. More specifically, a digital multiplier is realized for use in multiplication of two digital words of same or different length, using the output of the first stage as a reference signal for the second stage. As will be appreciated, additional analog to digital signal conversion is not needed between stages, thereby reducing the quantization noise that is produced.

Other similar uses and applications of the circuit 45 will be apparent to those skilled in the art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A digital processing circuit comprising:
   a source for producing a sigma-delta modulated pulse density stream first input signal;
   a first node for receiving the sigma-delta modulated pulse density stream first input signal;
   a second node for receiving a digital second input signal;
   a source of pulses having a known pulse sequence;
   a delta adder circuit connected to receive said pulses having a known pulse sequence on a first input, and having a second input;
   and a switch connected to receive said first input signal and said source of pulses having a known pulse sequence for selectively connecting either the first input signal or said pulses having a known pulse sequence to the second input of said delta adder circuit in accordance with a state of the second input signal to produce a sigma-delta modulated output pulse density stream at an output of said delta adder circuit.

2. The circuit of claim 1 further comprising a low pass filter for demodulating the sigma-delta modulated output pulse density stream to produce an analog output signal.

3. The circuit of claim 1 further comprising an analog input node for receiving an analog input signal, and wherein said source for producing a sigma-delta modulated pulse density stream first input signal comprises a sigma-delta modulator connected to said analog input node to convert said analog input signal to said sigma-delta modulated pulse density stream first input signal for delivery to said first node.

4. The circuit of claim 1 wherein said signal modulator comprises:
   a plurality of switches, each operated by a respective bit of said digital second input signal to switch between the sigma-delta modulated first input signal and a known pulse sequence for delivery to a switch output;
   a plurality of adder circuits connected in series to add the successive outputs of said plurality of switches to the sigma-delta modulated pulse first input signal to produce the sigma-delta modulated output pulse density stream.

5. The circuit of claim 4 further comprising a source of idle sequence pulses, said idle sequence pulses providing said known pulse sequence.

6. The circuit of claim 4 in which each of said adder circuits comprises a full binary adder and a D-type flip-flop, said full binary adder having two binary signal inputs and a carry input, and having a sum output and a carry output, said sum output being connected to said carry input through said D-type flip-flop.

7. The circuit of claim 6 wherein a first one of said adder circuits is connected to receive said known pulse sequence.

8. The circuit of claim 7 further comprising a source of idle sequence pulses, said idle sequence pulses providing said known pulse sequence.

9. The circuit of claim 2 wherein said demodulator comprises a low pass filter.

10. The circuit of claim 2 wherein said demodulator is a low pass filter.

11. A digital to analog converter for converting a digital signal having a plurality of bits, comprising:
    a sigma-delta modulator for encoding an analog reference signal to produce a sigma-delta modulated pulse stream reference signal;
    a delta adder for modulating the sigma-delta modulated pulse stream reference signal with a digital input signal to produce a digital sigma-delta modulated pulse density stream output signal; and
    a low pass filter for demodulating the digital sigma-delta modulated pulse density stream output signal to produce an analog output signal.

12. The digital to analog converter of claim 11 wherein said delta adder comprises:
    a plurality of adder circuits connected in series to weight and cumulatively add the sigma-delta modulated pulse stream reference signal in accordance with the logic states of the bits of the digital signal.

13. The circuit of claim 12 in which each of said adder circuits comprises a full binary adder and a D-type flip-flop, said full binary adder having two binary signal inputs and a carry input, and having a sum output and a carry output, said sum output being connected to said carry input through said D-type flip-flop.

14. The circuit of claim 13 wherein a first one of said adder circuits is connected to receive an idle pulse sequence.

15. An attenuator circuit for attenuating an input signal in accordance with the state of the bits of a digital control signal, comprising:
    a sigma-delta modulator for encoding an analog input signal to produce a sigma-delta modulated pulse stream input signal;
    a delta adder for modulating the sigma-delta modulated pulse stream input signal with the digital control signal to produce a digital sigma-delta modulated pulse density stream output signal; and
    a low pass filter for demodulating the digital sigma-delta modulated pulse density stream output signal to produce an analog output signal.

16. The digital to analog converter of claim 15 wherein said delta adder comprises:
    a plurality of adder circuits connected in series to weight and cumulatively add the sigma-delta modulated pulse stream input signal in accordance with the logic states of the bits of the digital control signal.

17. The circuit of claim 16 in which each of said adder circuits comprises a full binary adder and a D-type flip-flop, said full binary adder having two binary signal inputs and a carry input, and having a sum output and a carry output, said sum output being connected to said carry input through said D-type flip-flop.

18. The circuit of claim 17 wherein a first one of said adder circuits is connected to receive an idle pulse sequence.

19. A method for digitally multiplying an input signal by a digital signal to produce a multiplied output signal, comprising:

providing the input signal in a binary sigma-delta modulated signal form;

depending upon the state of each successive bit of the digital signal, selectively adding the binary sigma-delta modulated signal to a weighted, cumulating sum, beginning with an idle sequence to produce a binary sigma-delta modulated pulse density stream signal output.

20. The method of claim 19 further comprising a demodulating the binary sigma-delta modulated pulse density stream signal output to provide an analog output signal.

21. The method of claim 19 wherein said step of selectively adding the binary sigma-delta modulated signal comprises providing a plurality of serially connected adding stages, each comprising a full binary adder and a D-type flip-flop, said full binary adder having two binary signal inputs and a carry input, and having a sum output and a carry output, said sum output being connected to said carry input through said D-type flip-flop.

22. The method of claim 20 wherein said step of demodulating the binary sigma-delta modulated signal output comprises low pass filtering the binary sigma-delta modulated signal output.

23. A digital processing circuit comprising:

a source for producing a sigma-delta modulated pulse density stream first input signal;

a first node for receiving said sigma-delta modulated pulse first input signal;

a second node for receiving a digital second input signal;

a third node for receiving a digital third input signal;

a first signal modulator connected to receive said first and second input signals and for modulating the first input signal with the second input signal to produce an intermediate sigma-delta modulated output pulse density stream;

and a second signal modulator connected to receive said intermediate sigma-delta modulated output pulse density stream and third input signals and for modulating said intermediate signal with said third input signal to produce an output sigma-delta modulated output pulse density stream.

24. The circuit of claim 23 further comprising a low pass filter for demodulating the output sigma-delta modulated output pulse density stream to produce an analog output signal.

25. The circuit of claim 23 further comprising an analog input node for receiving an analog input signal, and a sigma-delta modulator connected to said analog input node to convert said analog input signal to said sigma-delta modulated pulse first input signal for delivery to said first node.

26. The circuit of claim 23 wherein said first and second signal modulators each comprises:

a plurality of switches, each operated by a respective bit of a digital input signal to switch between a sigma-delta modulated input signal and a known pulse sequence for delivery to a switch output;

a plurality of adder circuits connected in series to add the successive outputs of said plurality of switches to the sigma-delta modulated pulse input signal to produce a sigma-delta modulated output pulse density stream.

27. The circuit of claim 26 further comprising a source of idle sequence pulses, said idle sequence pulses providing said known pulse sequence.

28. The circuit of claim 26 in which each of said adder circuits comprises a full binary adder and a D-type flip-flop, said full binary adder having two binary signal inputs and a carry input, and having a sum output and a carry output, said sum output being connected to said carry input through said D-type flip-flop.

29. The circuit of claim 28 wherein a first one of said adder circuits is connected to receive said known pulse sequence.

30. The circuit of claim 29 further comprising a source of idle sequence pulses, said idle sequence pulses providing said known pulse sequence.

31. The circuit of claim 24 wherein said demodulator comprises a low pass filter.

32. The circuit of claim 24 wherein said demodulator is a low pass filter.

33. The circuit of claim 23 wherein said second and third signals are digital signals of different width.

34. The circuit of claim 23 wherein said second and third signals are digital signals of the same width.

35. A digital processing circuit for converting a digital input signal having a plurality of weighted bits into a pulse density serial signal, comprising:

a source for producing a sigma-delta modulated pulse density stream first input signal;

a plurality of switches operated to select between a first and a second pole in accordance with a state of a respective weighted bit of said digital input signal;

said first pole being connected to receive the sigma-delta modulated pulse density first input signal;

said second pole being connected to receive a delta idle sequence second input signal;

a plurality of delta adder circuits, each associated with a respective weighted bit of said digital input signal, said adder circuits being connected in series to add the successive outputs of said plurality of switches to the delta modulated second input signal to produce a sigma-delta modulated output pulse density stream;

and a signal modulator connected to receive said first and second input signals and for modulating the first input signal with the second input signal to produce the sigma-delta modulated output pulse density stream.

36. A digital processing circuit of claim 35 further comprising a low pass filter demodulator connected to receive the output sigma-delta pulse density stream to produce an analog output signal.

* * * * *